(12) United States Patent
Ando et al.

(10) Patent No.: US 9,058,982 B2
(45) Date of Patent: Jun. 16, 2015

(54) SILICON OXYNITRIDE FILM AND METHOD FOR FORMING SAME, AND SEMICONDUCTOR DEVICE

(75) Inventors: Yasunori Ando, Kyoto (JP); Eiji Takahashi, Kyoto (JP); Masaki Fujiwara, Kyoto (JP)

(73) Assignee: NISSIN ELECTRIC CO., LTD., Kyoto (JP)

(*) Notice: Subject to any disclaimer, the term of this patent is extended or adjusted under 35 U.S.C. 154(b) by 0 days.

(21) Appl. No.: 13/823,108

(22) PCT Filed: Dec. 8, 2010

(86) PCT No.: PCT/JP2010/007137
§ 371 (c)(1),
(2), (4) Date: Mar. 14, 2013

(87) PCT Pub. No.: WO2012/077163
PCT Pub. Date: Jun. 14, 2012

(65) Prior Publication Data
US 2013/0181291 A1 Jul. 18, 2013

(51) Int. Cl.
*H01L 21/02* (2006.01)
*C23C 16/30* (2006.01)
(Continued)

(52) U.S. Cl.
CPC ............ *H01L 21/0214* (2013.01); *C23C 16/30* (2013.01); *C23C 16/308* (2013.01);
(Continued)

(58) Field of Classification Search
CPC .............. H01L 21/0214; H01L 29/518; H01L 2924/059; H01L 21/02274; H01L 29/4908; H01L 29/7869; H01L 29/786; C23C 14/0676; C23C 16/308; C23C 16/10; C23C 16/30

USPC ................. 257/347, 758, 645, 646, 651, 776; 438/118, 622, 280, 769, 786
See application file for complete search history.

(56) References Cited

U.S. PATENT DOCUMENTS 5,872,065 A * 2/1999 Sivaramakrishnan ........ 438/784
5,976,973 A * 11/1999 Ohira et al. .................... 438/645
(Continued)

FOREIGN PATENT DOCUMENTS

JP H05-029301 2/1993
JP H08-078408 3/1996
(Continued)

OTHER PUBLICATIONS

Ohara et al, "Amorphous In—Ga—Zn—Oxide TFTs with Suppressed Variation for 4.0 inch QVGA AMOLED Display", AM-FPD '09 Digest of Technical Papers, The Japan Society of Applied Physics, Jul. 1, 2009, p. 227-230.
(Continued)

*Primary Examiner* — Jarrett Stark
*Assistant Examiner* — Bitew Dinke
(74) *Attorney, Agent, or Firm* — Jianq Chyun IP Office

(57) ABSTRACT

An insulating film that does not contain hydrogen or free fluorine and has good film properties is provided. A silicon oxynitride film includes silicon, nitrogen, oxygen, and fluorine, wherein the elemental percentage (N+O+F)/Si of the total (N+O+F) of nitrogen (N), oxygen (O), and fluorine (F) to silicon (Si) is in a range of 1.93 to 1.48, and in the silicon oxynitride film, an elemental percentage of silicon ranges from 0.34 to 0.41, an elemental percentage of nitrogen ranges from 0.10 to 0.22, an elemental percentage of oxygen ranges from 0.14 to 0.38, and an elemental percentage of fluorine ranges from 0.17 to 0.24. The film can be formed on a substrate by inductive coupling type plasma CVD whereby a plasma is generated by inductive coupling using a silicon tetrafluoride gas, a nitrogen gas, and an oxygen gas as a material gas.

4 Claims, 6 Drawing Sheets

(51) Int. Cl.
*H01L 29/786* (2006.01)
*H01L 29/49* (2006.01)

(52) U.S. Cl.
CPC ...... *H01L21/02274* (2013.01); *H01L 29/7869* (2013.01); *H01L 29/786* (2013.01); *H01L 29/4908* (2013.01); *H01L 29/78606* (2013.01)

(56) References Cited

U.S. PATENT DOCUMENTS

| | | | |
|---|---|---|---|
| 5,989,693 A * | 11/1999 | Yamasaki et al. | 428/216 |
| 6,077,764 A * | 6/2000 | Sugiarto et al. | 438/597 |
| 6,362,114 B1 * | 3/2002 | Sandhu et al. | 438/774 |
| 6,468,927 B1 * | 10/2002 | Zhang et al. | 438/779 |
| 6,472,336 B1 * | 10/2002 | Pangrle et al. | 438/784 |
| 6,503,557 B1 * | 1/2003 | Joret | 427/167 |
| 7,074,489 B2 * | 7/2006 | O'Neill et al. | 428/447 |
| 8,006,639 B2 * | 8/2011 | Kim et al. | 118/723 HC |
| 2001/0019903 A1 * | 9/2001 | Shufflebotham et al. | 438/788 |
| 2003/0162034 A1 * | 8/2003 | O'Neill et al. | 428/426 |
| 2003/0209805 A1 * | 11/2003 | Choi et al. | 257/758 |
| 2006/0046519 A1 * | 3/2006 | Tsuji et al. | 438/778 |
| 2006/0093758 A1 * | 5/2006 | Sakakura et al. | 428/1.6 |
| 2006/0269671 A1 * | 11/2006 | Kim et al. | 427/255.14 |
| 2007/0184181 A1 * | 8/2007 | Wada | 427/69 |
| 2007/0224430 A1 * | 9/2007 | Iwanaga | 428/446 |
| 2007/0299239 A1 * | 12/2007 | Weigel et al. | 528/349 |
| 2008/0132085 A1 * | 6/2008 | Luo et al. | 438/786 |
| 2008/0214017 A1 * | 9/2008 | Murakawa et al. | 438/778 |
| 2008/0296704 A1 * | 12/2008 | Wakabayashi | 257/410 |
| 2009/0057700 A1 * | 3/2009 | Jin et al. | 257/98 |
| 2010/0200851 A1 * | 8/2010 | Oikawa et al. | 257/43 |
| 2010/0224879 A1 * | 9/2010 | Miyairi et al. | 257/57 |
| 2011/0223415 A1 * | 9/2011 | Drescher et al. | 428/336 |

FOREIGN PATENT DOCUMENTS

| | | |
|---|---|---|
| JP | H10-012611 | 1/1998 |
| JP | 2003-060030 | 2/2003 |
| JP | 2009-076886 | 4/2009 |
| WO | WO 2009149889 A1 * | 12/2009 |

OTHER PUBLICATIONS

"Written Opinion of the International Searching Authority (Form PCT/ISA37)", mailed on Aug. 2, 2011, with English translation thereof, p. 1-p. 6, in which the listed references (JPH08-078408, JPH10-012611, JP2009-076886, JP2003-060030) were cited.

"International Search Report (Form PCT/ISA/210)", published on Jun. 14, 2012, with English translation thereof, p. 1-p. 6, in which the listed references (JPH08-078408, JPH10-012611, JP2009-076886, JP2003-060030) were cited.

* cited by examiner

SILICON OXYNITRIDE FILM AND METHOD FOR FORMING SAME, AND SEMICONDUCTOR DEVICE

CROSS-REFERENCE TO RELATED APPLICATION

This application is a 371 of international application of PCT application serial no. PCT/JP2010/007137, filed on Dec. 8, 2010. The entirety of the above-mentioned patent application is hereby incorporated by reference herein and made a part of this specification.

BACKGROUND OF THE INVENTION

1. Field of the Invention

The invention relates to a silicon oxynitride film used for a semiconductor device, e.g. a thin film transistor, an MOS transistor, etc., and a method for forming the silicon oxynitride film. More particularly, the invention relates to a semiconductor device including the silicon oxynitride film and an oxide semiconductor thin film transistor.

2. Description of Related Art

Non-patent Literature No. 1 discloses that, in an oxide semiconductor thin film transistor (OTFT) having a channel layer formed with an In—Ga—Zn—O (IGZO) oxide semiconductor, a silicon oxide film ($SiO_x$ film) is deposited as a protection film (passivation layer) by a plasma chemical vapor deposition (CVD) method using a mixture gas of $SiH_4$/$N_2O$ (referring to Table 1, the left column of page 228, for example).

It is disclosed in the Non-patent Literature No. 1 that the hydrogen in the silicon oxide film used as the protection film is assumed to be the cause of the shift of a threshold value $V_{th}$, which is one of the indexes for determining the reliability of the oxide semiconductor thin film transistor (referring to the left column of page 229, for example).

On the other hand, Patent Literature No. 1 discloses that a silicon oxide film ($SiO_2$ film) containing no hydrogen can be formed by a plasma CVD method using a $SiF_4$ gas to replace the conventional $SiH_4$ gas source, using an $O_2$ gas as the oxide gas, and using an $N_2$ gas as the carry gas (referring to paragraph 0009, for example).

PRIOR TECHNICAL LITERATURE

Patent Literature

Patent Literature No. 1: Japanese Patent Publication No. 5-29301 (paragraph 0009)

Non-Patent Literature

Non-patent Literature No. 1: Hiroki Ohara, et al., AM-FPD '09 Digest, p 227-230, 2009

SUMMARY OF THE INVENTION

Problem to be Solved

As mentioned above, Non-patent Literature No. 1 discloses that the hydrogen in the protection film may bring adverse influence to the properties of the oxide semiconductor thin film transistor, and Patent Literature No. 1 discloses the technique for forming a silicon oxide film that contains no hydrogen by using $SiF_4$ gas to replace the conventional $SiH_4$ gas serving as the gas source. However, the technique of Patent Literature No. 1 still faces problems.

According to the technique disclosed in Patent Literature No. 1, although the silicon oxide film contains no hydrogen, the silicon oxide film contains free fluorine $F_2$ released from fluoride. The above is shown by the following formula, which is also recited as formula (2) in paragraph 0009 of Patent Literature No. 1.

$$SiF_4 + O_2 \rightarrow SiO_2 + 2F_2 \quad \text{[formula 1]}$$

When free fluorine is contained in the film, the fluorine may move in the film or be released out of the film as outgas, which deteriorates the stability of the film structure. Consequently, the stability of film quality and the film properties become worse.

Accordingly, the invention provides an insulating film that contains no hydrogen or free fluorine and has good film properties.

Solution to the Problem

A silicon oxynitride film relating to the invention is a film formed of silicon, nitrogen, oxygen, and fluorine. The silicon oxynitride film is characterized in that an elemental percentage (N+O+F)/Si of the total (N+O+F) of nitrogen N, oxygen O, and fluorine F to silicon Si is in a range of 1.93 to 1.48, and in the film, an elemental percentage of silicon ranges from 0.34 to 0.41, an elemental percentage of nitrogen ranges from 0.10 to 0.22, an elemental percentage of oxygen ranges from 0.14 to 0.38, and an elemental percentage of fluorine ranges from 0.17 to 0.24.

The silicon oxynitride film contains no hydrogen. Accordingly, the problem that the hydrogen in the film may bring adverse influence to the properties of the semiconductor device is solved.

Furthermore, the silicon oxynitride film contains no free fluorine. Accordingly, the problem that free fluorine may deteriorate the stability of film quality and properties of the film is solved.

Moreover, because the elemental percentages of the elements are within the aforementioned ranges, the silicon oxynitride film has high breakdown field intensity and low leakage current density and is excellent as an insulating film.

The silicon oxynitride film may be used for a semiconductor device. As a specific example, the silicon oxynitride film may serve as a gate insulating film, an etching stopper, and a protection film, etc. of a thin film transistor using an oxide semiconductor.

The silicon oxynitride film may be formed on a substrate by an inductive coupling type plasma CVD method, whereby plasma is generated by inductive coupling, using a silicon tetrafluoride gas ($SiF_4$), a nitrogen gas, and an oxygen-containing gas as a material gas.

Effect of the Invention

The silicon oxynitride film according to claim 1 contains no hydrogen. Accordingly, the problem that the hydrogen in the film may bring adverse influence to the properties of the semiconductor device is solved.

In addition, the silicon oxynitride film contains no free fluorine. Accordingly, the problem that free fluorine may deteriorate the stability of film quality and properties of the film is solved.

Moreover, because the elemental percentages of the elements are within the ranges recited in claim 1, the silicon oxynitride film has high breakdown field intensity and low leakage current density and is excellent as an insulating film.

According to the invention of claim 2, because the semiconductor device includes the silicon oxynitride film of claim 1, the semiconductor device has good properties and favourable property stability.

According to the invention of claim 3, because the silicon oxynitride film of claim 1 is used as at least one of the gate insulating film, the etching stopper, and the protection film, the oxide semiconductor thin film transistor having good properties and favourably stable property is formed.

The following effects are achieved according to the invention of claim 4. That is, because the gases used as the material gas do not contain hydrogen, the silicon oxynitride film containing no hydrogen is formed. Silicon tetrafluoride gas ($SiF_4$) and nitrogen gas ($N_2$) are difficult to be discharged and decomposed in comparison with the commonly-used silane ($SiH_4$) and ammonia ($NH_3$). However, according to the inductive coupling type plasma CVD method, a great inductive field is generated in the plasma, and thus the silicon tetrafluoride gas $SiF_4$ and nitrogen gas $N_2$ can still be efficiently discharged and decomposed. As a result, the generated plasma 40 has high density, and the silicon oxynitride film can be efficiently formed.

According to the invention of claim 5, the adverse influence resulting from heat given to the substrate and film is suppressed, and the silicon oxynitride film having good properties is formed.

DESCRIPTION OF THE EMBODIMENTS

Figure 1:
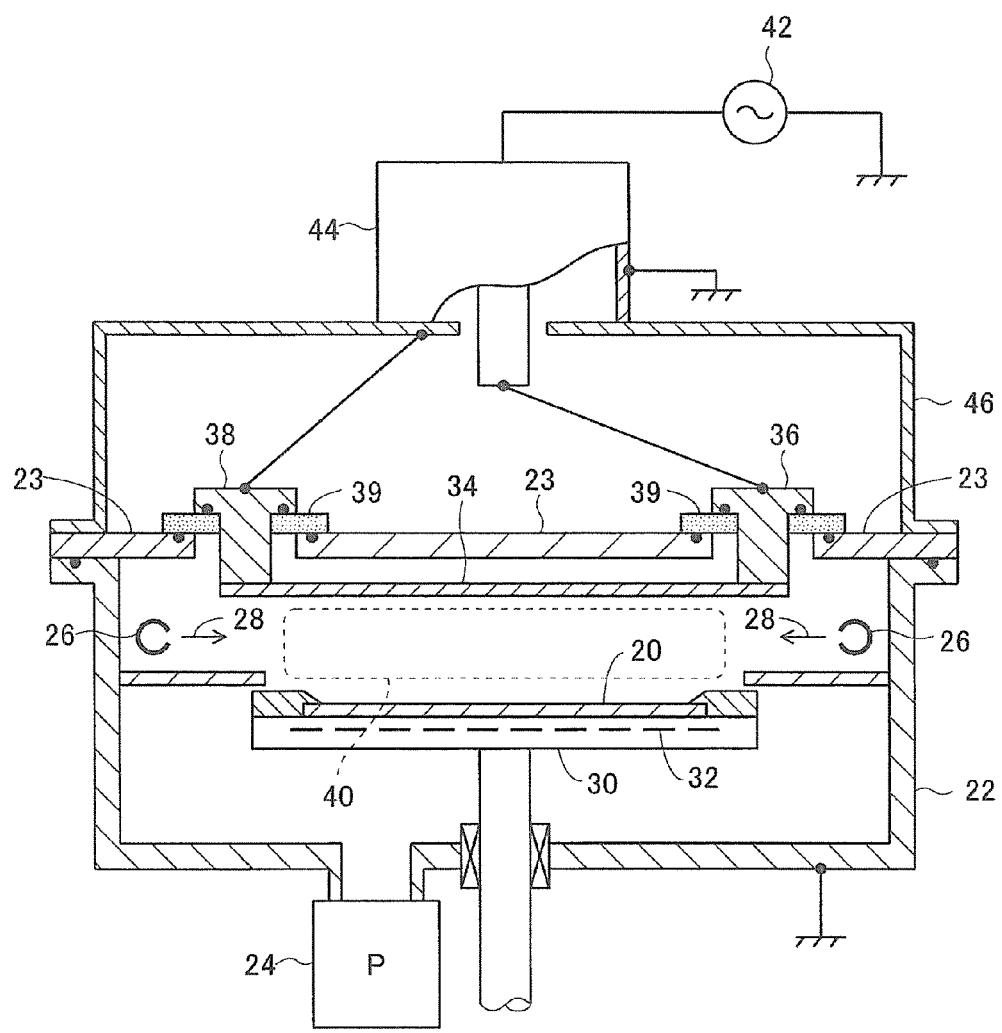
FIG. 1 is a schematic cross-sectional view exemplifying an inductive coupling type plasma CVD device.

FIG. 1 illustrates an example of an inductive coupling type plasma CVD device, which forms a film on a substrate by an inductive coupling type plasma CVD method.

The plasma CVD device is an inductive coupling type plasma CVD device that generates plasma 40 through an inductive field generated by flowing a high-frequency current from a high-frequency power source 42 to a planar conductor 34 and uses the plasma 40 to perform film formation on a substrate 20 by a plasma CVD method.

The substrate 20 may be a substrate 2 described hereinafter (referring to FIG. 7), a substrate used for a flat panel display (FPD), e.g. liquid crystal display or organic electro-luminescence display, or a flexible substrate used for a flexible display, for example, but is not restricted to the foregoing.

The plasma CVD device includes a vacuum container 22 made of a metal, for example, and a vacuum is formed inside the vacuum container 22 by a vacuum exhaust device 24.

A material gas 28 corresponding to a processing detail that is to be performed on the substrate 20 is introduced into the vacuum container 22 through a gas inlet tube 26. As described below, for example, a mixture gas of a silicon tetrafluoride gas $SiF_4$, a nitrogen gas $N_2$, and an oxygen-containing gas is introduced as the material gas 28. The oxygen-containing gas is, for example, an oxygen gas $O_2$. However, the oxygen-containing gas can also be a nitrogen dioxide gas $N_2O$, etc.

A holder 30 is disposed in the vacuum container 22 for holding the substrate 20. A heater 32 is disposed in the holder 30 for heating the substrate 20.

In the vacuum container 22, or more specifically, at an inner side of a ceiling plane 23 of the vacuum container 22, a planar conductor 34 having a rectangular planar shape is disposed opposite to a substrate holding side of the holder 30. The planar shape of the planar conductor 34 may be rectangular or square, etc. The planar shape of the planar conductor 34 may be determined according to a planar shape of the substrate 20, for example.

High-frequency power is supplied between a power supply terminal and an end terminal, which are respectively at two sides of the planar conductor 34 in a longitudinal direction, from the high-frequency power source 42 via an integration circuit 44 and via a power supply electrode 36 and a terminal electrode 38. Accordingly, a high-frequency current flows to the planar conductor 34. A frequency of the high-frequency power outputted from the high-frequency power source 42 is 13.56 MHz generally, for example, but not restricted thereto.

The power supply electrode 36 and the terminal electrode 38 are installed on the ceiling plane 23 of the vacuum container 22 through insulating flanges 39 respectively. Packing for vacuum sealing is respectively disposed between the aforementioned elements. Preferably, a shield box 46 is disposed to cover the top of the ceiling plane 23, as illustrated in the example, so as to prevent high frequency leakage.

As described above, by flowing the high-frequency current to the planar conductor 34, a high-frequency magnetic field is generated around the planar conductor 34 and consequently an inductive field is generated in a direction reverse to the high-frequency current. In the vacuum container 22, due to the inductive field, electrons are accelerated and the material gas 28 near the planar conductor 34 is ionized, and the plasma 40 is generated near the planar conductor 34. The plasma 40 is diffused to the vicinity of the substrate 20. And, with the plasma 40, film formation can be carried out on the substrate 20 by the plasma CVD method.

By performing the inductive coupling type plasma CVD method with the aforementioned plasma CVD device and using the silicon tetrafluoride gas $SiF_4$, nitrogen gas $N_2$, and oxygen gas $O_2$ as the material gas 28, a silicon oxynitride film containing silicon Si, nitrogen N, oxygen O, and fluorine F is formed on the substrate 20. Meanwhile, a temperature of the substrate 20 is preferably maintained in a range of 100° C. to 300° C. Moreover, the nitrogen dioxide gas $N_2O$ may be used as the oxygen-containing gas in replacement of oxygen gas $O_2$.

When the film foaming method is used, because the gases used as the material gas 28 contain no hydrogen, it is possible to form the silicon oxynitride film without hydrogen on the substrate 20. Silicon tetrafluoride gas $SiF_4$ and nitrogen gas $N_2$ may be difficult to be discharged and decomposed in comparison with the commonly-used silane $SiH_4$ and ammonia $NH_3$. However, according to the inductive coupling type plasma CVD method, a great inductive field can be generated in the plasma 40, and thus the silicon tetrafluoride gas $SiF_4$ and nitrogen gas $N_2$ can still be efficiently discharged and decomposed. As a result, the generated plasma 40 has high density, and the silicon oxynitride film can be efficiently formed on the substrate 20.

In addition, by maintaining the temperature of the substrate 20 within the aforementioned range, adverse influence resulting from heat provided to the substrate 20 and the film is suppressed and the silicon oxynitride film can be formed with favorable properties. To be more specific, the silicon oxynitride film having the following superior properties can be formed on the substrate 20.

Figure 2:
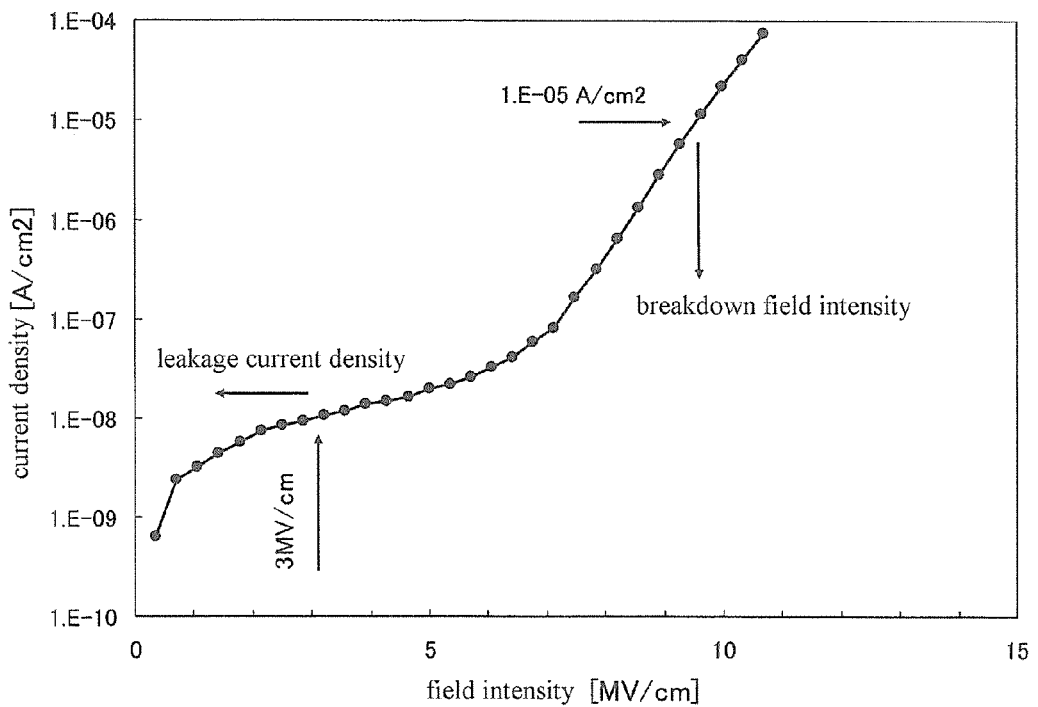
FIG. 2 is a chart exemplifying a relationship between the field intensity and the current density of a silicon oxynitride film obtained by a film forming method of the invention.

The relationship between the field intensity and current density of the silicon oxynitride film obtained by the aforementioned film forming method is exemplified in FIG. 2. In this case, the film formation conditions include the following: a silicon substrate is used as the substrate 20; the temperature of the substrate 20 is maintained at 200° C.; the flow rates of the gases of the material gas 28 are: $SiF_4$ of 50 ccm, $N_2$ of 200 ccm, and $O_2$ of 10 ccm; and a pressure in the vacuum container 22 is maintained at 0.67 Pa.

Then, an aluminum electrode is stacked on the obtained silicon oxynitride film to form an MIS (metal-silicon oxynitride film-semiconductor) structure for detecting the characteristics shown in FIG. 2.

Definitions used in this specification are explained below. As shown in FIG. 2, the breakdown field intensity refers to the field intensity when the current density is equal to $1\times10^{-5}$ $A/cm^2$, and the leakage current density refers to the current density when the field intensity is equal to 3 MV/cm.

As can be known from FIG. 2, the breakdown field intensity of the silicon oxynitride film obtained by the aforementioned film forming method is about 10 MV/cm and the leakage current density thereof is about $1\times10^{-8}$ $A/cm^2$. The breakdown field intensity of the conventional insulating film ($SiN_x$ or $SiO_2$) is at most 6-8 MV/cm. The aforementioned film forming method achieves higher breakdown field intensity. As to the leakage current density, the silicon oxynitride film is the same as the conventional insulating film.

Figure 3:
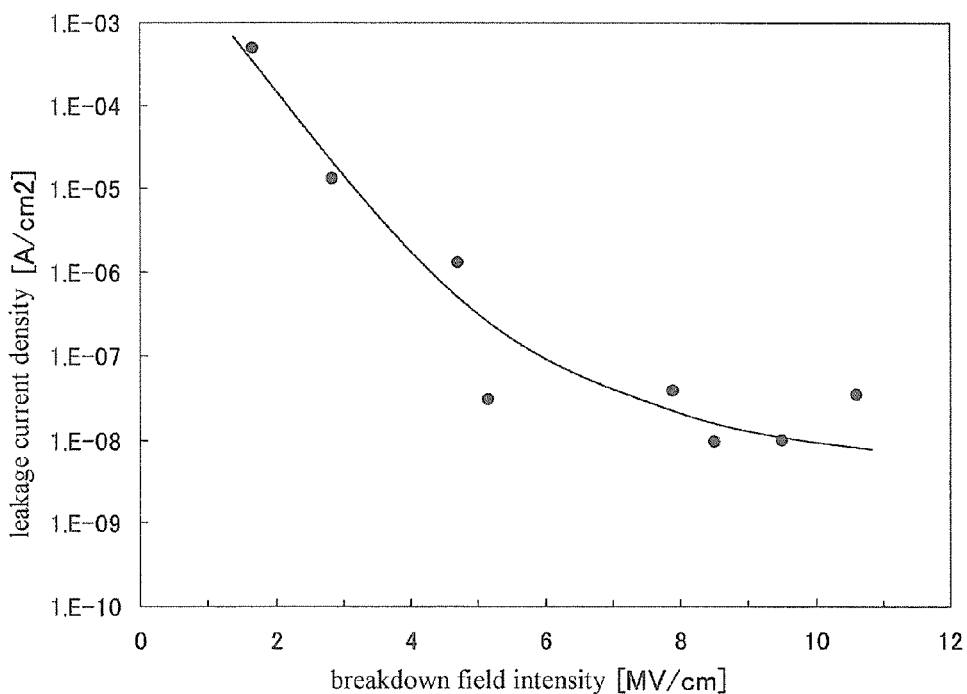
FIG. 3 is a chart exemplifying a relationship between the breakdown field intensity and the leakage current density of a silicon oxynitride film obtained by a film forming method of the invention.

FIG. 3 exemplifies the relationship between the breakdown field intensity and the leakage current density of the silicon oxynitride film that is formed by varying the flow rate condition of the gases (i.e. $SiF_4$, $N_2$, and $O_2$) of the material gas 28, the discharging power for plasma generation, and the pressure condition of the gas in the vacuum container 22. It is confirmed that, as the breakdown field intensity of the silicon oxynitride film is improved (raised), the leakage current density tends to improve (decrease) as well. The improvement is considered to be resulted from the reduction of defects of the silicon oxynitride film. From this aspect, it can also be said that the silicon oxynitride film is an insulating film with favorable properties.

Figure 8:
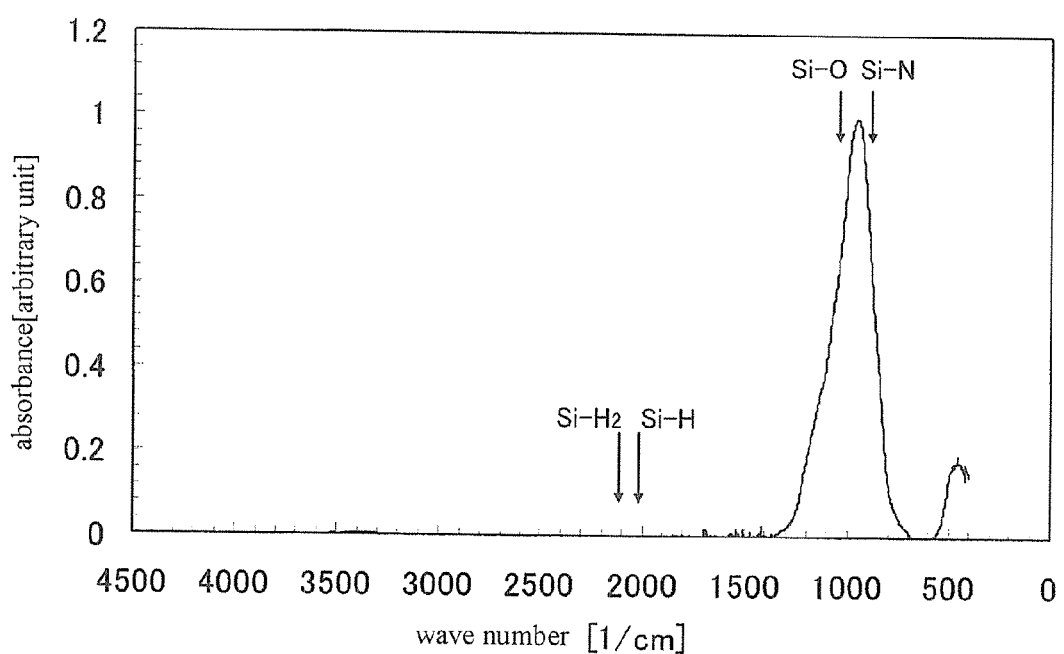
FIG. 8 is a chart exemplifying an infrared absorption spectrum of a silicon oxynitride film obtained by a film forming method of the invention.

The composition of the silicon oxynitride film obtained by the aforementioned film forming method is assessed using X-ray photoelectron spectroscopy (XPS). The result confirms that the obtained film is composed of silicon Si, nitrogen N, oxygen O, and fluorine F. Further, Fourier-transform type infrared spectroscopy (FT-IR) is used to confirm whether the silicon oxynitride film contains any hydrogen. The result is shown in FIG. 8. As shown by the infrared absorption spectrum, since no infrared absorption peak of Si—H (wave number: 2000/cm) and Si—$H_2$ (wave number: 2100/cm) is observed, it is confirmed that no hydrogen is contained in the silicon oxynitride film.

Figure 4:
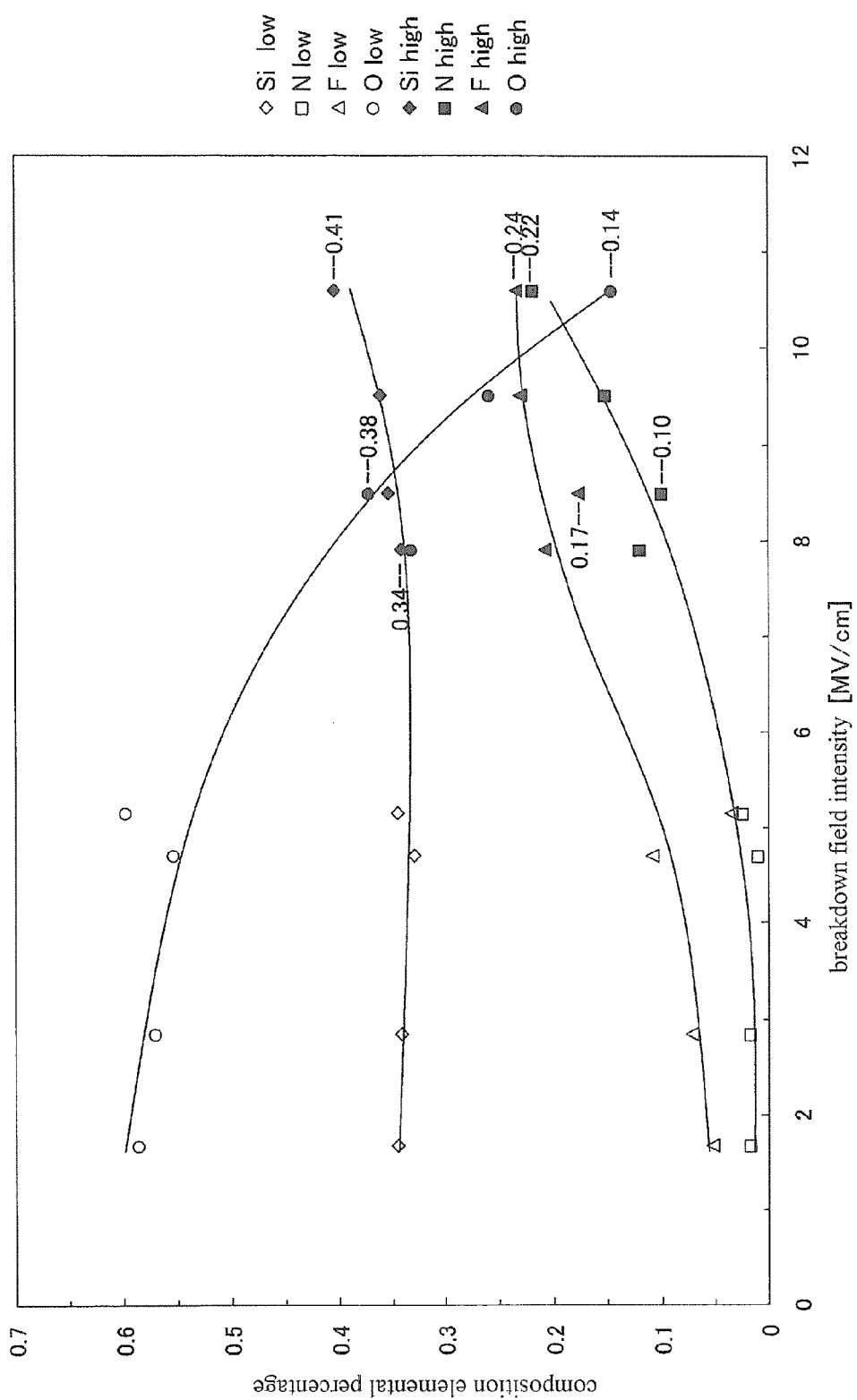
FIG. 4 is a chart exemplifying a relationship between the breakdown field intensity and the composition elemental percentage when the composition elemental percentage of a silicon oxynitride film obtained by a film forming method of the invention is varied.

FIG. 4 exemplifies the relationship between the breakdown field intensity and the composition elemental percentage when the composition elemental percentage of the silicon oxynitride film obtained by the aforementioned film forming method is varied. The composition elemental percentage is determined according to the area of the peak waveform of a signal corresponding to each element, obtained by the XPS. The mark "high" following the element symbol in FIG. 8 indicates that the breakdown field intensity is equal to or greater than 7 MV/cm, and "low" indicates that the breakdown field intensity is less than 7 MV/cm.

As shown in FIG. 4, in the case that the elemental percentage of silicon Si ranges from 0.34 to 0.41, the elemental percentage of nitrogen N ranges from 0.10 to 0.22, the elemental percentage of oxygen O ranges from 0.14 to 0.38, and the elemental percentage of fluorine F ranges from 0.17 to 0.24 in the silicon oxynitride film, high breakdown field intensity of 7 MV/cm or more (specifically, about 8 MV/cm or more) is achieved. Therefore, it is confirmed that the silicon oxynitride film with this composition has high insulating properties.

On the other hand, if the silicon oxynitride film has a structure similar to a silicon oxide film, the silicon oxynitride film may be represented by $Si(O_xN_yF_z)_R$, wherein the affixed x, y, and z represent the percentages of the elements respectively, and R indicates the elemental percentage of (N+O+F) with respect to Si, which can be represented by R=(N+O+F)/Si.

Figure 5:
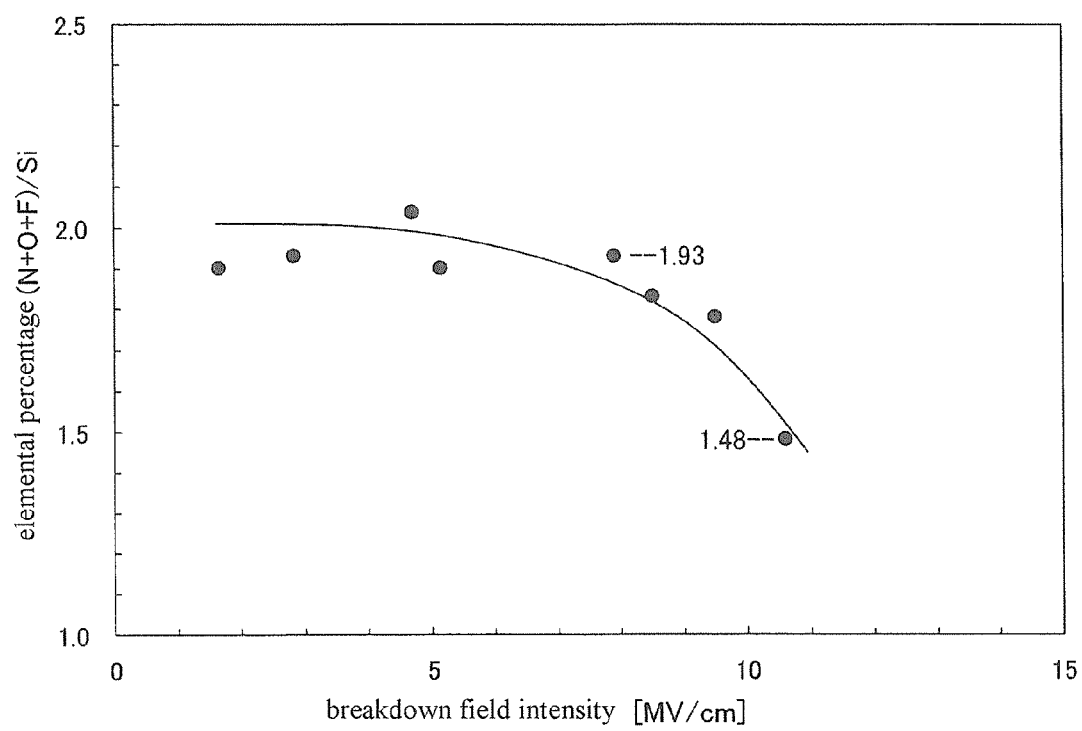
FIG. 5 is a chart exemplifying a relationship between the breakdown field intensity and the elemental percentage (N+O+F)/Si of a silicon oxynitride film obtained by a film forming method of the invention.

FIG. 5 exemplifies the relationship between the breakdown field intensity and the elemental percentage of R=(N+O+F)/Si of the silicon oxynitride film obtained by the aforementioned film forming method.

According to FIG. 5, it can be confirmed that the breakdown field intensity is raised as the elemental percentage of R=(N+O+F)/Si decreases from about 2. Particularly, when R=(N+O+F)/Si is in the range of 1.93 to 1.48, high breakdown field intensity of 7 MV/cm or more (specifically, about 8 MV/cm or more) is obtained. The breakdown field intensity may be low when R is about 1.93. Nevertheless, by combining the condition of R with the conditions of the elemental percentages shown in FIG. 4, the silicon oxynitride film having high breakdown field intensity and high insulating properties can be achieved.

That is to say, when the elemental percentage, i.e. R=(N+O+F)/Si, of the total (N+O+F) of nitrogen N, oxygen O, and fluorine F to silicon Si is in the range of 1.93 to 1.48, and the elemental percentage of silicon Si ranges from 0.34 to 0.41, the elemental percentage of nitrogen N ranges from 0.10 to 0.22, the elemental percentage of oxygen O ranges from 0.14 to 0.38, and the elemental percentage of fluorine F ranges from 0.17 to 0.24 in the film, high breakdown field intensity of 7 MV/cm or more (specifically, about 8 MV/cm or more) can be obtained. Therefore, it is confirmed that the silicon oxynitride film with this composition has high insulating properties.

Figure 6:
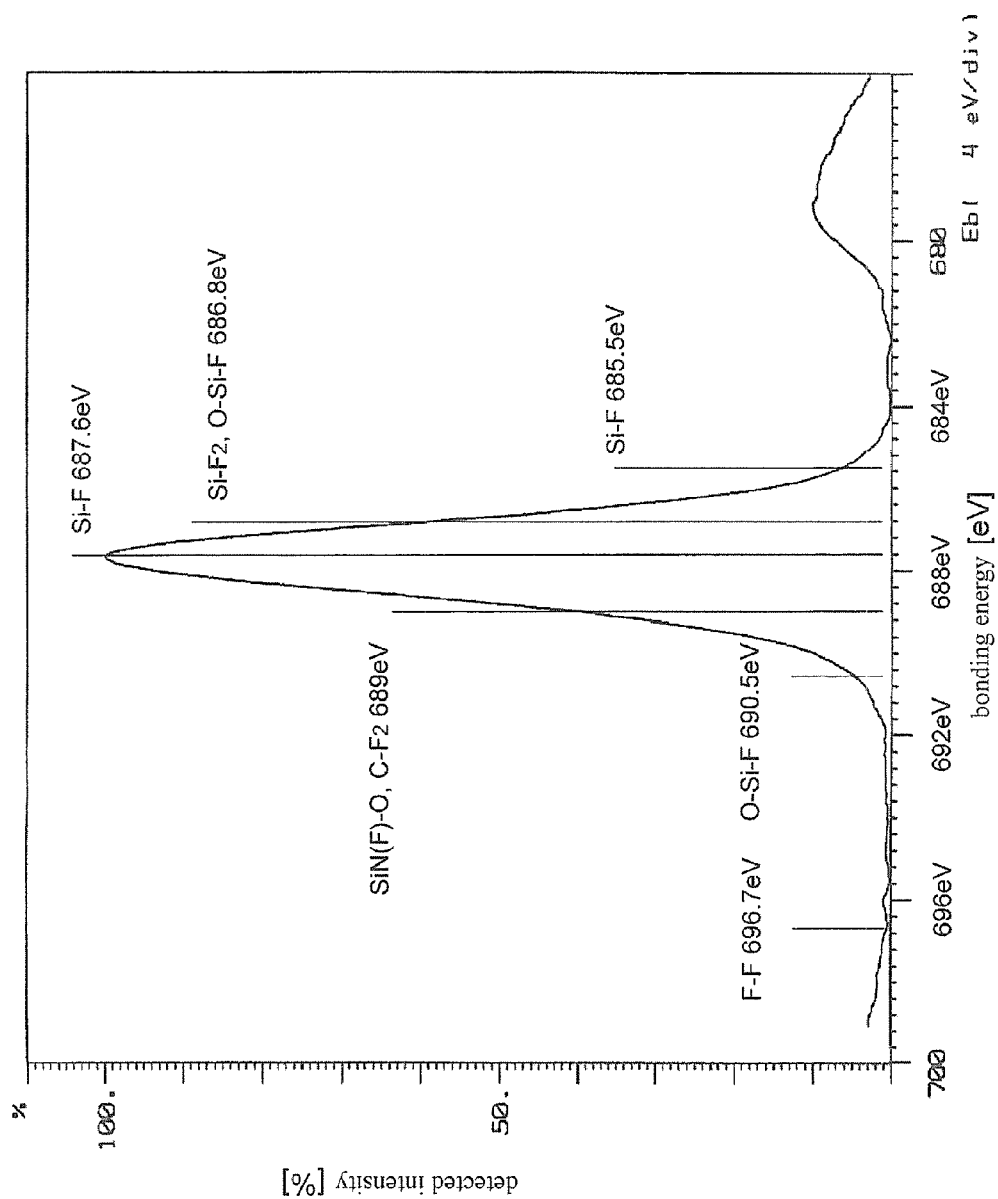
FIG. 6 is a chart exemplifying an XPS spectrum of a silicon oxynitride film obtained by a film forming method of the invention.

FIG. 6 exemplifies an XPS spectrum of the silicon oxynitride film obtained by the aforementioned film forming method.

"Si—F" in FIG. 6 indicates that, when the fluorine atom is bonded with the silicon atom, the bonding energy of electrons of the fluorine atom is 685.5 eV or 687.6 eV. "Si—$F_2$" indicates that, in the case silicon is bonded with fluorine and two fluorine atoms are bonded with to the silicon atom, the bonding energy of the electrons of the fluorine atoms is 686.8 eV. "O—Si—F" indicates that, when silicon, oxygen, and fluorine are bonded, the bonding energy of the electrons of the fluorine atom is 686.8 eV or 690.5 eV. On the contrary, a bonding state equivalent to the bonding energy of 686.8 eV indicates the case of Si—$F_2$ and the case of O—Si—F. The value of the bonding energy of 689 eV indicates the case of the bonding states of SiN(F)—O or C—$F_2$. The symbol of SiN(F)—O indicates that fluorine is introduced into the silicon oxynitride film, and in a case that the fluorine is bonded with an atom respective to the bonded silicon and nitrogen. Moreover, "C—$F_2$" indicates the case that carbon atom is bonded with two fluorine atoms. "F—F" represents a structure of fluorine atoms bonded with each other, wherein the bonding energy is 696.7 eV.

As known from the XPS spectrum, the bonding energy 696.7 eV of F—F does not form a peak. Thus, it can be determined that the silicon oxynitride film contains no free fluorine.

To conclude the above, the silicon oxynitride film contains no hydrogen, as illustrated in FIGS. 4 and 5 and the descriptions thereof. Accordingly, the issue that the hydrogen in the film may bring adverse influence to the properties of the semiconductor device is solved.

Furthermore, the silicon oxynitride film contains no free fluorine, as illustrated in FIG. 6 and the description thereof. Accordingly, the issue that free fluorine may deteriorate the stability of film quality and properties of the film is solved.

Additionally, in the silicon oxynitride film, the elemental percentage (N+O+F)/Si of the total (N+O+F) of nitrogen N, oxygen O, and fluorine F to silicon Si is in the range of 1.93 to 1.48, and the elemental percentage of silicon Si ranges from 0.34 to 0.41, the elemental percentage of nitrogen N ranges from 0.10 to 0.22, the elemental percentage of oxygen O ranges from 0.14 to 0.38, and the elemental percentage of fluorine F ranges from 0.17 to 0.24 in the film. Accordingly, the silicon oxynitride film that has high breakdown field intensity and low leakage current density can be formed as an excellent insulating film.

The silicon oxynitride film may be used as the insulating film for semiconductor devices, such as thin film transistor, MOS transistor, etc. Because of the aforementioned advantages of the silicon oxynitride film, semiconductors formed of the silicon oxynitride film have good properties and favorable property stability.

Figure 7:
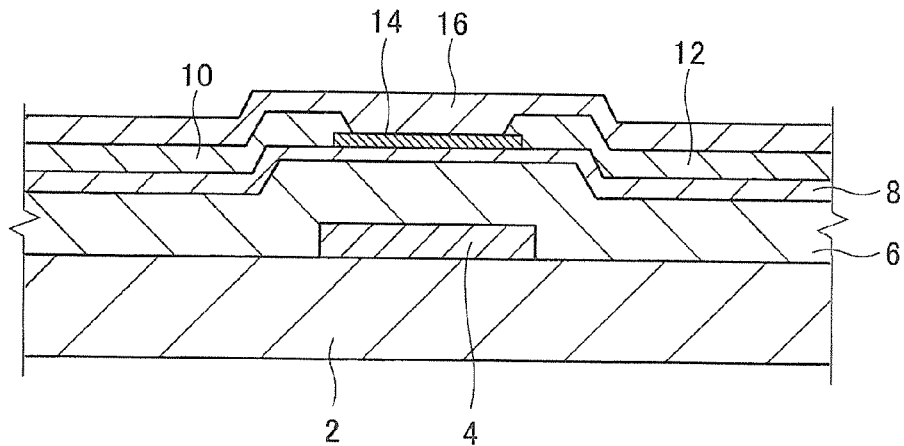
FIG. 7 is a schematic cross-sectional view exemplifying a structure of a thin film transistor using an oxide semiconductor.

As a more specific example, the silicon oxynitride film can be applied to a thin film transistor using an oxide semiconductor. FIG. 7 illustrates the structure of the thin film transistor that uses the oxide semiconductor.

The thin film transistor is an oxide semiconductor thin film transistor (OTFT) having a channel layer formed of an In—Ga—Zn—O (IGZO) oxide semiconductor, wherein a gate electrode 4 and a gate insulating film 6 are formed on a substrate 2 (glass substrate, for example), and a semiconductor layer 8 formed of In—Ga—Zn—O is disposed on the gate insulating film 6. On the semiconductor layer 8, a source electrode 10 and a drain electrode 12 are formed with a channel region therebetween. On the channel region, an etching stopper 14 is formed for stopping the etching. Moreover, a protection film 16 is disposed on the source electrode 10, the drain electrode 12, and the etching stopper 14 is formed for protecting these elements.

If the gate insulating film 6, the etching stopper 14, or the protection film 16 of the oxide semiconductor thin film transistor contains hydrogen, the hydrogen may bring adverse influence to the properties of the thin film transistor, as mentioned above.

The silicon oxynitride film contains no hydrogen. Thus, when the silicon oxynitride film is used as at least one of the gate insulating film 6, the etching stopper 14, and the protection film 16, the oxide semiconductor thin film transistor can be formed with good properties and favorable property stability.

INDUSTRIAL APPLICABILITY

The silicon oxynitride film relating to the invention can be used for semiconductor devices, e.g. thin film transistor, MOS transistor, etc. To be more specific, the silicon oxynitride film can serve as the gate insulating film, etching stopper, protection film, etc. of thin film transistors using oxide semiconductors. Moreover, such semiconductor devices can be used on displays, e.g. liquid crystal display or organic electro-luminescence display.

What is claimed is:

1. A semiconductor device, comprising a silicon oxynitride film, wherein the silicon oxynitride film comprises silicon, nitrogen, oxygen and fluorine but having no free fluorine:
   an elemental percentage of a total of nitrogen (N), oxygen (O), and fluorine (F) to silicon Si((N+0+F)/Si) is in a range of 1.93 to 1.48; and
   in the silicon oxynitride film, an elemental percentage of the silicon ranges from 0.34 to 0.41, an elemental percentage of the nitrogen ranges from 0.10 to 0.22, an elemental percentage of the oxygen ranges from 0.14 to 0.38, and an elemental percentage of the fluorine ranges from 0.17 to 0.24.

2. A thin film transistor, using an oxide semiconductor, wherein:
   the silicon oxynitride film of claim 1 is used as at least one of a gate insulating film, an etching stopper, and a protection film.

3. A forming method of a silicon oxynitride film, comprising:
   forming the silicon oxynitride film of claim 1 on a substrate by an inductive coupling type plasma chemical vapor deposition (CVD) method, whereby a plasma is generated by inductive coupling, using a silicon tetrafluoride gas ($SiF_4$), a nitrogen gas, and an oxygen-containing gas as a material gas.

4. The forming method of claim 3, wherein
   a temperature of the substrate is maintained in a range of 100° C. to 200° C. when the silicon oxynitride film is formed.

* * * * *